United States Patent
Lee et al.

(10) Patent No.: US 8,716,727 B2
(45) Date of Patent: May 6, 2014

(54) AC LIGHT EMITTING DEVICE HAVING PHOTONIC CRYSTAL STRUCTURE AND METHOD OF FABRICATING THE SAME

(75) Inventors: Jae Ho Lee, Yongin (KR); Yeo Jin Yoon, Ansan-Si (KR); Eu Jin Hwang, Jeonju-si (KR); Jong Kyu Kim, Seoul (KR); Jun Hee Lee, Seoul (KR)

(73) Assignee: Seoul Opto Device Co., Ltd., Ansan-si (KR)

( * ) Notice: Subject to any disclaimer, the term of this patent is extended or adjusted under 35 U.S.C. 154(b) by 983 days.

(21) Appl. No.: 12/065,063

(22) PCT Filed: Sep. 6, 2006

(86) PCT No.: PCT/KR2006/003541
§ 371 (c)(1),
(2), (4) Date: Feb. 27, 2008

(87) PCT Pub. No.: WO2007/055468
PCT Pub. Date: May 18, 2007

(65) Prior Publication Data
US 2008/0237613 A1    Oct. 2, 2008

(30) Foreign Application Priority Data
Nov. 10, 2005 (KR) .................. 10-2005-0107516

(51) Int. Cl.
*H01L 33/00* (2010.01)

(52) U.S. Cl.
USPC .............. 257/98; 257/79; 257/88; 257/99; 257/100

(58) Field of Classification Search
USPC ................. 257/79, 88, 98, 99, 100
See application file for complete search history.

(56) References Cited

U.S. PATENT DOCUMENTS

| | | | |
|---|---|---|---|
| 5,955,749 A | * | 9/1999 | Joannopoulos et al. ........ 257/98 |
| 2005/0082545 A1 | | 4/2005 | Wierer, Jr. et al. |

(Continued)

FOREIGN PATENT DOCUMENTS

| | | | |
|---|---|---|---|
| EP | 1553641 A1 | | 7/2005 |
| JP | 2001-153331 | * | 6/2001 |

(Continued)

OTHER PUBLICATIONS

Chinese Preliminary Notice of the First Office Action dated Sep. 8, 2009.

(Continued)

*Primary Examiner* — Tan N Tran
(74) *Attorney, Agent, or Firm* — H.C. Park & Associates, PLC

(57) ABSTRACT

Disclosed is an AC light emitting device having photonic crystal structures and a method of fabricating the same. The light emitting device includes a plurality of light emitting cells and metallic wirings electrically connecting the light emitting cells with one another. Further, each of the light emitting cells includes a first conductive type semiconductor layer, a second conductive type semiconductor layer disposed on one region of the first conductive type semiconductor layer, and an active layer interposed between the first and second conductive type semiconductor layers. In addition, a photonic crystal structure is formed in the second conductive type semiconductor layer. The photonic crystal structure prevents light emitted from the active layer from laterally propagating by means of a periodic array, such that light extraction efficiency of the light emitting device can be improved. Furthermore, the metallic wirings electrically connect a plurality of light emitting cells with one another such that an AC light emitting device can be provided.

18 Claims, 3 Drawing Sheets

(56) References Cited

U.S. PATENT DOCUMENTS

| | | |
|---|---|---|
| 2005/0152424 A1* | 7/2005 | Khalfin et al. ............... 372/64 |
| 2005/0205883 A1 | 9/2005 | Wierer, Jr. et al. |
| 2006/0093008 A1* | 5/2006 | Mochizuki ............ 372/50.23 |

FOREIGN PATENT DOCUMENTS

| | | |
|---|---|---|
| JP | 2001-156331 | 6/2001 |
| KR | 10-2001-0008570 | 2/2001 |
| TW | I226708 | 1/2005 |
| TW | I233218 | 5/2005 |
| TW | I238546 | 8/2005 |
| TW | 200534500 | 10/2005 |
| WO | 2005/062389 | 7/2005 |

OTHER PUBLICATIONS

Non-Final Office Action of U.S. Appl. No. 12/546,155 issued on Sep. 16, 2010.

Notice of Allowance of Dec. 30, 2010 in U.S. Appl. No. 12/546,155.

* cited by examiner

AC LIGHT EMITTING DEVICE HAVING PHOTONIC CRYSTAL STRUCTURE AND METHOD OF FABRICATING THE SAME

RELATED APPLICATIONS

This application is a U.S. national phase application of PCT International Application No. PCT/KR2006/03541, filed Sep. 6, 2006, which claims priority to Korean Patent Application No. 10-2005-0107516, filed Nov. 10, 2005, the contents of which are incorporated herein by reference in their entirety.

FIELD OF THE INVENTION

The present invention relates to a light emitting device, and more particularly, to an AC light emitting device having photonic crystal structures.

BACKGROUND OF THE INVENTION

Recently, a GaN-based light emitting diode (LED) has been widely used as a light emitting device. GaN-based LEDs have significantly advanced the LED technology and have been employed in various applications including full color LED displays, LED traffic signals, white LEDs and the like.

Recently, high-efficiency white LEDs have been expected to replace fluorescent lamps. In particular, the efficiency of white LEDs is approaching that of ordinary fluorescent lamps. However, the LED efficiency can be further improved, thus its continuous improvement will be required.

Two major approaches to improve the efficiency of LEDs have been attempted. The first approach is to enhance the internal quantum efficiency determined by the crystal quality and the epitaxial layer structure, and the second one is to increase the light extraction efficiency.

Since the internal quantum efficiency currently reaches 70~80%, there is little room for further improvement of the internal quantum efficiency. However, the light extraction efficiency may be further improved. The technology for improving the light extraction efficiency mainly relates to the enlargement of the "escape cone." However, the enlargement of the escape cone cannot completely eliminate light loss due to the total internal reflection. Further, even for light radiated into the escape cone, reflection loss occurs due to the refractive index mismatch between the LED and the surrounding media.

A new approach to reduce total internal reflection and reflection loss and improve light extraction efficiency is disclosed in U.S. Pat. No. 5,955,749, entitled "Light emitting device utilizing a periodic dielectric structure" by Joannopoulos et al. According to the U.S. Pat. No. 5,955,749, a lattice of holes is formed in semiconductor layers of a light emitting diode to create photonic crystals. The lattice creates a medium with a periodically varying dielectric constant and affects a path of light transmitting through the medium. This lattice forms a photonic band gap (PBG) and photons having energy within the PBG cannot propagate inside the photonic crystal. Therefore, if a photonic crystal is formed such that the energy of photons emitted by LED is within the PBG, the lateral propagation of photons is prohibited to allow all the photons to be exited from the LED to the outside, so that the light extraction efficiency can be improved.

However, the aforementioned U.S. Pat. No. 5,955,749 discloses an LED having GaAs-based n-type, p-type and active layers, and the lattice of holes is formed on these layers. Thus, during the formation of the holes by etching the GaAs-based layers, the layers can be easily damaged. In addition, GaAs has a very high surface recombination rate at which holes and electrons are recombined in a surface thereof. The surface recombination of holes and electrons does not generate light having a desired wavelength. Thus, the light quantum efficiency is seriously reduced, since the surface area of the active layer is increased as the lattice of holes is formed.

Furthermore, a light emitting diode is a semiconductor device which is formed into a p-n junction structure of semiconductors and emits light by the recombination of electrons and holes, and the light emitting diode is generally driven by current flowing in one direction. Thus, in a case where the light emitting diode is driven by alternating current, an A/D converter is required to convert AC into DC. As the A/D converter is utilized together with a light emitting diode, the installation cost of the light emitting diode is increased. In particular, it is difficult to utilize a light emitting diode as general household illumination. In order to replace the existing fluorescent lamps with LEDs, there is a need for a novel light emitting diode which can be driven using an AC power source without an A/D converter.

The present invention is conceived to solve the aforementioned problems in the prior art. An object of the present invention is to provide a light emitting device of which light extraction efficiency is improved by employing a photonic crystal structure and which can be directly driven using an AC power source without an A/D converter.

According to an aspect of the present invention for achieving the object, there is provided an AC light emitting device having photonic crystal structures. The light emitting device includes a plurality of light emitting cells and metallic wirings for electrically connecting the light emitting cells with one another. Further, each of the light emitting cells includes a first conductive type semiconductor layer, a second conductive type semiconductor layer disposed on one region of the first conductive type semiconductor layer, and an active layer interposed between the first and second conductive type semiconductor layers. In addition, a photonic crystal structure is formed in the second conductive type semiconductor layer. The photonic crystal structure prevents light emitted from the active layer from laterally propagating, such that light extraction efficiency of the light emitting device can be improved. Furthermore, the metallic wirings electrically connect a plurality of light emitting cells with one another such that an AC operated light emitting device can be provided.

The photonic crystal structure may have various shapes and be regularly arranged two-dimensionally. For example, the photonic crystal structure may include a lattice of holes which are formed in the second conductive type semiconductor layer and arranged two-dimensionally. Alternatively, the photonic crystal structure may include a periodic unevenness formed by partially etching the second conductive type semiconductor layer or a lattice of second conductive type semiconductor rods formed by etching the second conductive type semiconductor layer. The photonic crystal structures are periodically arranged to create a photonic band gap and also prevent light from laterally propagating. Thus, the light emitted from the active layer cannot be laterally propagated by means of the photonic crystal structure and can thus be exited to the outside. Accordingly, light extraction efficiency of the light emitting device can be improved.

Furthermore, first electrode pads may be formed in other regions of the first conductive type semiconductor layers. In addition, transparent electrodes cover the second conductive type semiconductor layers. Moreover, second electrode pads may be disposed on the transparent electrodes. In this case, each of the metallic wirings connects the first and second electrode pads of the adjacent light emitting cells.

According to another aspect of the present invention for achieving the object, there is provided a method of fabricating an AC light emitting device having photonic crystal structures. The method of the present invention comprises forming a first conductive type semiconductor layer, an active layer and a second conductive type semiconductor layer on a substrate. The second conductive type semiconductor layer, the active layer and the first conductive type semiconductor layer are patterned to form a plurality of light emitting cells. Each of the light emitting cells includes an isolated first conductive type semiconductor layer, a second conductive type semiconductor layer disposed on one region of the isolated first conductive type semiconductor layer, an active layer interposed between the isolated first conductive type semiconductor layer and the second conductive type semiconductor layer, and a photonic crystal structure formed in the second conductive type semiconductor layer. Metallic wirings for electrically connecting the light emitting cells having the photonic crystal structure are then formed. According to the present invention, since the photonic crystal structure is formed in the second conductive type semiconductor layer, a fabricating process can be simplified. Further, since the active layer and the first conductive type semiconductor layer need not be etched, the etching time can be shortened. Accordingly, etching damages which may occur in the first conductive type semiconductor layer, the active layer and the second conductive type semiconductor layer can also be reduced. In addition, since the metallic wirings electrically connect the light emitting cells with one another, an AC operated light emitting device can be provided.

The photonic crystal structure may be formed by etching the second conductive type semiconductor layer using photolithographic and etching processes, and an e-beam lithography or hologram technique can be used.

Further, transparent electrodes are formed on the second conductive type semiconductor layers having the photonic crystal structure. In addition, first electrode pads may be formed on other regions of the first conductive type semiconductor layers, and second electrode pads may be formed on the transparent electrodes. Each of the metallic wirings connects the first and second electrode pads of the adjacent light emitting cells.

According to the present invention, an AC light emitting device having photonic crystal structures can be provided, in which light extraction efficiency can be significantly increased.

DETAILED DESCRIPTION

Figure 1:
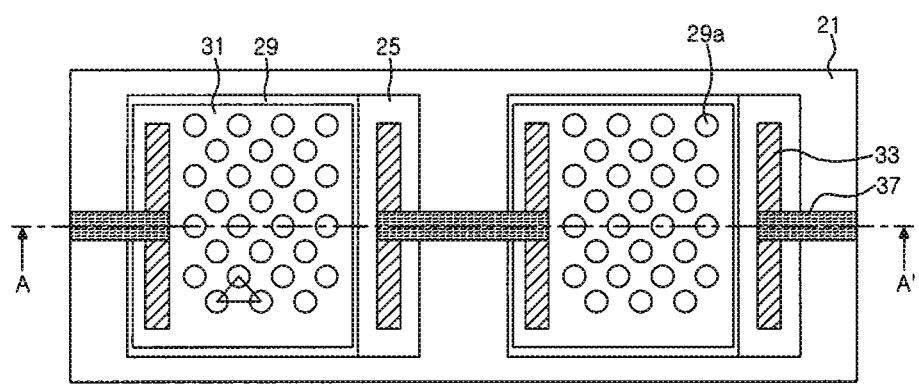
FIG. 1 is a plan view of an AC light emitting device having photonic crystal structures according to an embodiment of the present invention.

Hereinafter, preferred embodiments of the present invention will be described in detail with reference to the accompanying drawings. The embodiments are provided as an illustration to fully convey the spirit of the present invention to those skilled in the art. Thus, the present invention is not limited to the embodiments which will be described below, but may be implemented in other forms. In the drawings, the width, length, thickness, etc. of components may be exaggerated for the sake of convenience. Throughout the descriptions, like reference numerals designate like elements.

Figure 2:
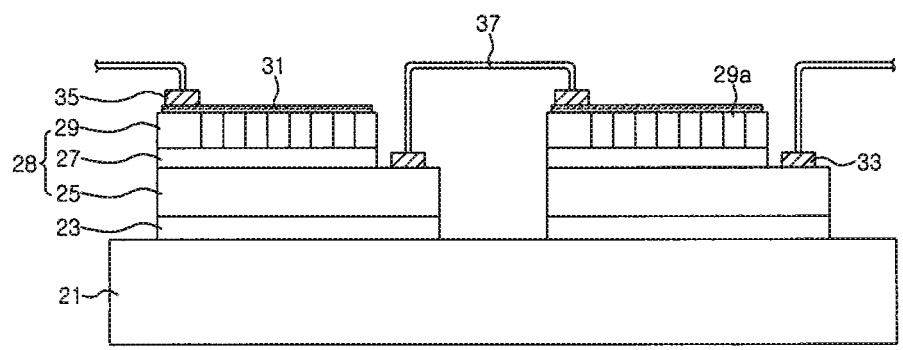
FIG. 2 is a sectional view of the AC light emitting device taken along line A-A' of FIG. 1.
Figure 3:
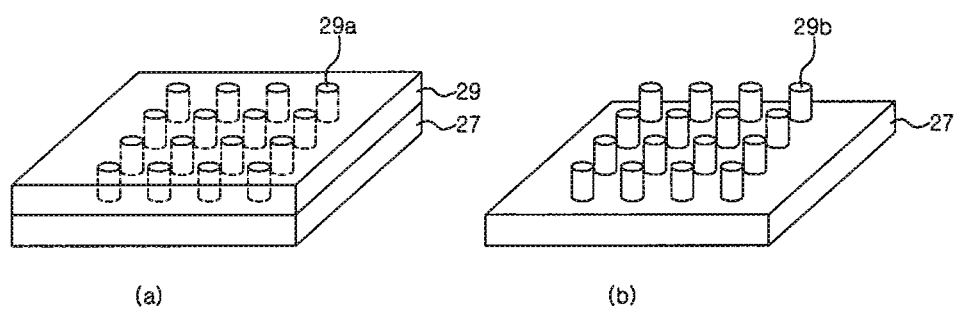
FIG. 3 is a perspective view illustrating a photonic crystal structure according to an embodiment of the present invention.

FIG. 1 is a plan view of an AC light emitting device having photonic crystal structures according to an embodiment of the present invention, FIG. 2 is a sectional view taken along line A-A' of FIG. 1, and FIGS. 3 (a) and (b) is a perspective view illustrating a variety of photonic crystal structures according to the present invention.

Referring to FIGS. 1 and 2, a plurality of light emitting cells 28 are disposed on a substrate 21. The substrate 21 may be an insulating or conductive substrate.

Each of the light emitting cells 28 comprises a first conductive type semiconductor layer 25, a second conductive type semiconductor layer 29 disposed on one region of the first conductive type semiconductor layer, and an active layer 27 interposed between the first and second conductive type semiconductor layers. Here, the first and second conductive types are of an n-type and a p-type, respectively, or vice versa.

Each of the first conductive type semiconductor layer 25, the active layer 27 and the second conductive type semiconductor layer 29 may be formed of a gallium nitride semiconductor material, i.e. (B, Al, In, Ga)N. The constituents and composition of the active layer 27 are chosen in such a manner that light having a desired wavelength, e.g. ultraviolet rays or blue light can be emitted. Each of the first and second conductive type semiconductor layers 25 and 29 is formed of a material having a band gap wider than that of the active layer 27.

Further, a buffer layer 23 may be interposed between the light emitting cells 28 and the substrate 21. The buffer layer 23 reduces the effects of a lattice mismatch between the substrate 21 and the first conductive type semiconductor layer 25 to be formed on the substrate 21.

Furthermore, a photonic crystal structure is formed in the second conductive type semiconductor layer 29. The photonic crystal structure may be formed in such a manner that the second conductive type semiconductor layer 29 is etched either to form a lattice of holes 29a as illustrated in FIG. 3 (a), or to form a lattice of rods 29b as illustrated in FIG. 3 (b). In addition, the photonic crystal structure may be a periodic unevenness formed by partially etching the second conductive type semiconductor layer 29. The lattice parameter and the diameter of holes or rods in the photonic crystal structure are chosen in such a manner that light energy radiated from the active layer 27 falls within the light band gap. Usually, they are determined by the light wavelength and the refractive index of the second conductive type semiconductor layer.

Since the photonic crystal structure is formed in the second conductive type semiconductor layer 29, it is not necessary to etch the active layer 27 and the first conductive type semiconductor layer 25. Thus, the active layer 27 and the first conductive type semiconductor layer 25 hardly experience damages due to the etching. In addition, since the etching time is shortened, the second conductive type semiconductor layer 29 can also experience less damage due to the etching.

The photonic crystal structure causes a periodic variation of dielectric constants, and thus, a photonic band gap is created. As shown in FIG. 1, the holes 29a or rods 29b may be arranged in a triangular or hexagonal form, but the present invention is not limited thereto. For example, the holes or rods may be arranged in other various forms such as a matrix form.

Further, the holes 29a or rods 29b may have a circular cross-section as illustrated in the figures, but may have other various cross sections including a rectangular one, a hexagonal one and the like.

Furthermore, a transparent electrode 31 is formed on the second conductive type semiconductor layer 29 having the aforementioned photonic crystal structure. The transparent electrode 31 is formed of a material capable of transmitting light emitted from the active layer 27 and ohmic-contacted with the second conductive type semiconductor layer 29. At this time, the holes 29a or the empty space between the rods 29b may be filled with insulating materials having different refractive indexes from the second conductive type semiconductor layer 29. The insulating material is employed to prevent the transparent electrode 31 from coming into direct contact with the active layer 27. The insulating material can be omitted, and thus, the empty space between the rods 29b or the holes 29a may be filled with air.

A first electrode pad 33 may be formed on other region of the first conductive type semiconductor layer 25. The first electrode pad 33 is ohmic-contacted with the first conductive type semiconductor layer 25. Furthermore, a second electrode pad 35 may be formed on the transparent electrode 31.

The first electrode pads 33 and the second electrode pads 35 are connected with each other through metallic wirings 37. The metallic wirings 37 electrically connect adjacent light emitting cells 28 with one another such that arrays of light emitting cells connected in series can be formed. Such serial arrays are connected in reverse parallel to an AC power source to provide a light emitting device suitable for AC operation. Alternatively, a bridge rectifier can be interposed between the array and an AC power source such that the array can be operated by the AC power source. The AC operation of an array of light emitting cells will be explained later with reference to FIGS. 8 and 9.

According to the embodiment, a light emitting device with improved light extraction efficiency can be provided by forming a photonic crystal structure in the second conductive type semiconductor layer 29. In addition, an AC light emitting device can be provided by allowing the light emitting cells to be electrically connected with each other through the metallic wirings 37.

FIGS. 4 to 7 are sectional views illustrating a method of fabricating an AC light emitting device according to an embodiment of the present invention.

Figure 4:
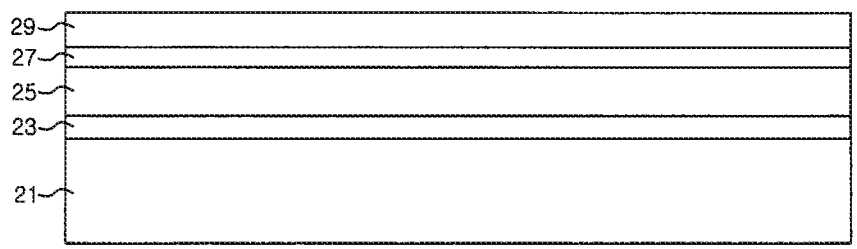
FIGS. 4 to 7 are sectional views illustrating a method of fabricating an AC light emitting device according to an embodiment of the present invention.

Referring to FIG. 4, a first conductive type semiconductor layer 25, an active layer 27 and a second conductive type semiconductor layer 29 are formed on a substrate 21. In addition, a buffer layer 23 may be formed on the substrate 21, before forming the first conductive type semiconductor layer 25.

The substrate 21 may be formed of sapphire ($Al_2O_3$), silicon carbide (SiC), zinc oxide (ZnO), silicon (Si), gallium arsenide (GaAs), gallium phosphide (GaP), lithium-alumina ($LiAl_2O_3$), boron nitride (BN), aluminum nitride (AlN) or gallium nitride (GaN), which can be selected depending on materials of semiconductor layers to be formed on the substrate 21. In a case where a GaN semiconductor layer is formed, the substrate 21 is usually formed of sapphire or silicon carbide (SiC).

The buffer layer 23 is formed to buffer the lattice mismatch between the substrate 21 and the semiconductor layer 25 which will be formed on the substrate 21. For example, the buffer layer 23 may be formed of GaN or AlN. In a case where the substrate 21 is conductive, the buffer layer 23 is preferably formed of an insulating or semi-insulating layer.

Alternatively, the buffer layer may be formed of AlN or semi-insulating GaN.

Each of the first conductive type semiconductor layer 25, the active layer 27 and the second conductive type semiconductor layer 29 may be formed of a GaN based semiconductor material, i.e. (B, Al, In, Ga)N. Constituents and composition of the active layer 27 are chosen in such a manner that light having a desired wavelength can be emitted. Each of the first and second conductive type semiconductor layers 25 and 29 is formed of a material having a band gap wider than that of the active layer 27. The first and second conductive type semiconductor layers 25 and 29 and the active layer 27 may be intermittently or continuously grown using a metalorganic chemical vapor deposition (MOCVD), molecular beam epitaxy (MBE) or hydride vapor phase epitaxy (HVPE) technique.

Here, the first and second conductive types may be an n-type and a p-type, respectively, or vice versa. In case of a GaN compound semiconductor layer, the n-type semiconductor layer can be formed by doping silicon as an impurity and the p-type semiconductor layer can be formed by doping magnesium as an impurity.

Figure 5:
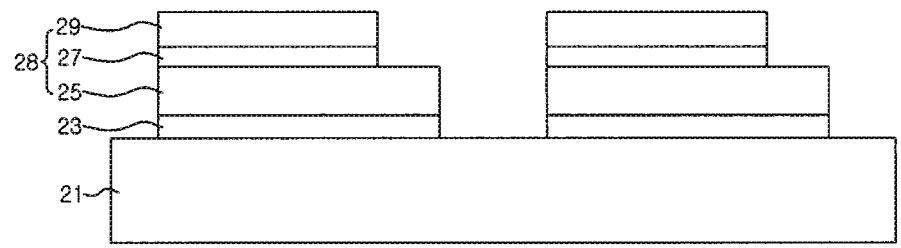

Referring to FIG. 5, the second conductive type semiconductor layer 29, the active layer 27 and the first conductive type semiconductor layer 25 are patterned to isolate the first conductive type semiconductor layer 25. At this time, the buffer layer 23 may be patterned and isolated together with the above layers. The first and second conductive type semiconductor layers 25 and 29 and the active layer 27 may be patterned through photolithographic and etching processes.

In the meantime, the second conductive type semiconductor layer 29 and the active layer 27 are patterned to be placed on one region of the isolated first conductive type semiconductor layer 25, as shown in the figure. Accordingly, a portion of the isolated first conductive type semiconductor layer 25 is exposed.

Figure 6:
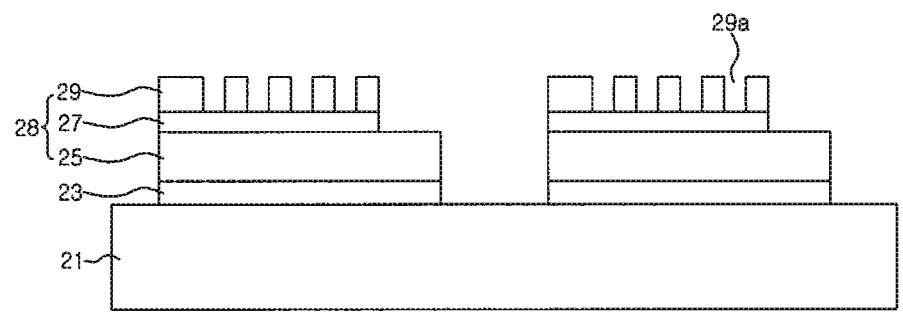

Referring to FIG. 6, photonic crystal structures are formed in the patterned second conductive type semiconductor layers 29. The photonic crystal structures are formed by patterning the second conductive type semiconductor layers 29 using photolithographic and etching processes. The photonic crystal structure may have either a lattice of holes 29a arranged two dimensionally as shown in FIG. 3 (a) or a lattice of rods 29b arranged two dimensionally as shown in FIG. 3 (b). In addition, the photonic crystal structure may be a periodic unevenness formed by partially etching the second conductive type semiconductor layer 29.

When etching the second conductive type semiconductor layer 29 to form the holes 29a or rods 29b, the active layer 27 and the first conductive type semiconductor layer 25 may be etched. However, since it is not necessary to etch the active layer 27 and the first conductive type semiconductor layer 25, the etching time can be shortened as compared with the prior art. In addition, in a case where the photonic crystal structure is confined within the second conductive type semiconductor layer 29, the increase of a surface area due to the photonic crystal structure can be reduced and thus the surface recombination rate at which holes and electrons are recombined in a surface can also be reduced.

The second conductive type semiconductor layer may be patterned using, for example, an e-beam lithography or hologram technique and other various etching techniques, for example, dry etching techniques.

Here, although it has been described in the present invention that the photonic crystal structures have been formed after isolating the light emitting cells 28 from one anther, the photonic crystal structures can be formed before isolating the light emitting cells 28 from one another. That is, as explained above with reference to FIG. 4, the photonic crystal structures may be formed by patterning the second conductive type semiconductor layer 29 after forming the first conductive type semiconductor layer 25, the active layer 27 and the second conductive type semiconductor layer 29 on the substrate 21.

Figure 7:
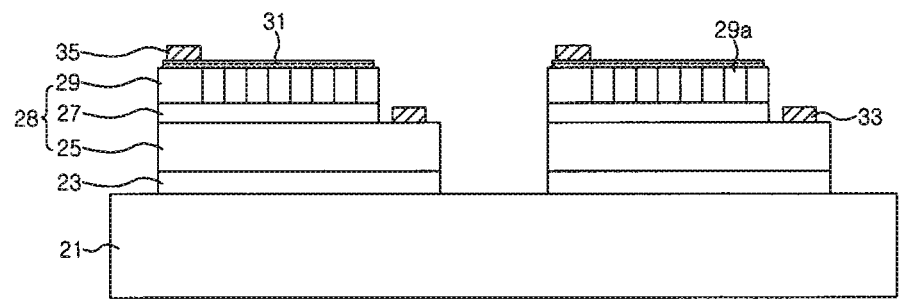

Referring to FIG. 7, transparent electrodes 31 are formed on the second conductive type semiconductor layers 29 having the photonic crystal structures. The transparent electrodes 31 may be formed using a lift-off technology. The transparent electrode 31 may be made of any material so long as the material can transmit light emitted from the active layer 27. For example, Ni/Au or ITO (Indium Tin Oxide) film may be employed. Furthermore, before forming the transparent electrode 31, the holes 29a or the empty space between the rods 29b may be filled with insulating materials. The insulating material has a different refractive index from the second conductive type semiconductor layer 29 and is selected to prevent the transparent electrode 31 from being electrically connected to the active layer 27. In a case where the transparent electrode 31 is not brought into direct contact to the active layer 27 without the insulating material, the insulating material can be omitted.

Further, first electrode pads 33 are formed on other regions of the isolated first conductive type semiconductor layers 25. The first electrode pads 33 may be formed using a lift-off technique. In addition, second electrode pads 35 are formed on a certain region of the transparent electrodes 31. The second electrode pads 35 may also be formed using a lift-off technique. Since the second electrode pad 35 absorbs light, the photonic crystal structure needs not be formed in the region of the second conductive type semiconductor layer 29 where the second electrode pad 35 will be formed. The first and second electrode pads 33 and 35 may be formed at the same time. The first electrode pads 33 and/or the second electrode pads 35 may be formed of Ti/Au.

Then, metallic wirings 37 are formed to electrically connect the first and second electrode pads 33 and 35 on adjacent light emitting cells 28. Consequently, the light emitting device of FIG. 2 is completed. The metallic wirings 37 may be formed using the conventional air-bridge or step-cover process.

Figure 8:
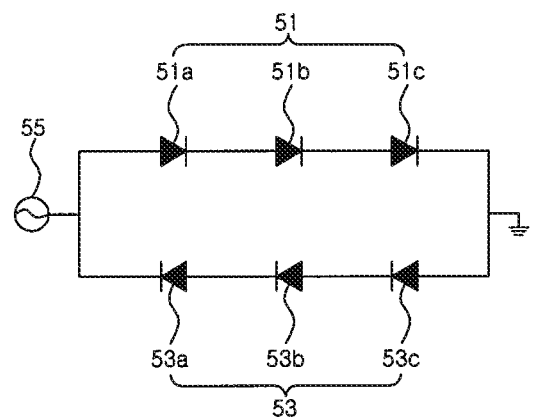
FIGS. 8 and 9 are circuit diagrams illustrating the operation of an AC light emitting device according to an embodiment of the present invention.
Figure 9:
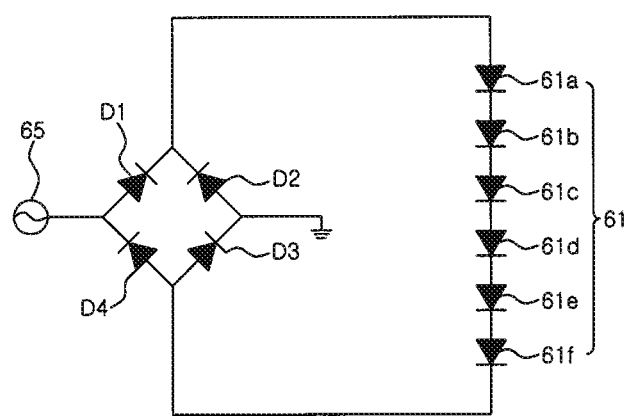

FIGS. 8 and 9 are circuit diagrams illustrating the AC operation of a light emitting diode chip according to the embodiment of the present invention. Here, FIG. 8 is a circuit diagram illustrating the AC operation of two arrays of serially connected light emitting cells which are connected with each other in a reverse parallel. FIG. 9 is a circuit diagram illustrating the AC operation of an array of serially connected light emitting cells using a bridge rectifier connected thereto.

Referring to FIG. 8, light emitting cells 51a, 51b and 51c are serially connected to form a first serial light emitting cell array 51, while other light emitting cells 53a, 53b and 53c are serially connected to from a second serial light emitting cell array 53. Here, the "serial light emitting cell array" means an array of light emitting cells connected in series with one another.

Both ends of each of the first and second serial arrays 51 and 53 are connected to an AC power source 55 and a ground, respectively, through lead terminals. The first and second serial arrays are connected in a reverse parallel between the AC power source and the ground. That is, both ends of the first and second serial arrays are electrically connected to each other and are arranged such that the light emitting cells are driven by means of currents flowing in opposite directions to each other. That is, as shown in the figure, the anodes and cathodes of the light emitting cells included in the first serial array 51 are arranged in opposite direction to those in the second serial array 53.

Thus, when the AC power source 55 has a positive phase, the light emitting cells included in the first serial array 51 are turned on to emit light and the light emitting cells included in the second serial array 53 are turned off. On the contrary, when the AC power source 55 has a negative phase, the light emitting cells included in the first serial array 51 are turned off and the light emitting cells included in the second serial array 53 are turned on.

Consequently, the first and second serial arrays 51 and 53 are alternately turned on and off to allow a light emitting diode chip including the first and second serial arrays to continuously emit light.

In the meantime, the circuit of FIG. 8 has been configured in such a manner that both ends of the first and second serial arrays are connected to the AC power source 55 and the ground, respectively. However, the circuit may be configured in such a manner that both ends are connected to both terminals of the AC power source. In addition, although each of the first and second serial arrays is illustrated as including three light emitting cells, the present invention is not limited thereto. The number of the light emitting cells can be increased, if desired. Further, the number of the serial arrays can be further increased.

Referring to FIG. 9, a serial light emitting cell array 61 is comprised of light emitting cells 61a, 61b, 61c, 61d, 61e and 61f. Furthermore, a bridge rectifier including diode cells D1, D2, D3 and D4 is disposed between the AC power source 65 and the serial light emitting cell array 61 and between the ground and the serial light emitting cell array 61. The diode cells D1, D2, D3 and D4 may have the same structure as the light emitting cells, but the present invention is not limited thereto. That is, the diode cells may not emit light. An anode terminal of the serial light emitting cell array 61 is connected to a node between the diode cells D1 and D2, and a cathode terminal thereof is connected to a node between the diode cells D3 and D4. Further, a terminal of the AC power source 65 is connected to a node between the diode cells D1 and D4, and the ground is connected to a node between the diode cells D2 and D3.

When the AC power source 65 has a positive phase, the diode cells D1 and D3 of the bridge rectifier are turned on and the diode cells D2 and D4 are turned off. Thus, current flows to the ground via the diode cell D1 of the bridge rectifier, the serial light emitting cell array 61 and the diode cell D3 of the bridge rectifier.

On the other hand, when the AC power source 65 has a negative phase, the diode cells D1 and D3 of the bridge rectifier are turned off and the diode cells D2 and D4 are turned on. Thus, current flows to the AC power source via the diode cell D2 of the bridge rectifier, the serial light emitting cell array 61 and the diode cell D4 of the bridge rectifier.

Consequently, a bridge rectifier is connected to the serial light emitting cell array 61 such that the serial light emitting cell array can be continuously operated using the AC power source 65. Here, both terminals of the bridge rectifier are connected to the AC power source and the ground, respectively, but they may be connected to both terminals of the AC power source. In the meantime, in a case where AC power source is used to drive the serial light emitting cell array 61, ripples may occur. In order to avoid the ripples, an RC filter (not shown) can be employed.

According to this embodiment, a single serial light emitting cell array can be operated by means of an AC power source electrically connected thereto, and thus, the efficiency of light emitting cells can be increased as compared with the light emitting diode chip of FIG. 8.

The connection of light emitting cells described with reference to FIGS. 8 and 9 is merely to explain the AC operation of light emitting cells and can be implemented in various ways.

The invention claimed is:

1. An alternating current (AC) light emitting device, comprising:
a plurality of light emitting cells each comprising a first conductive type semiconductor layer, a second conductive type semiconductor layer disposed on one region of the first conductive type semiconductor layer, an active layer interposed between the first and second conductive type semiconductor layers, and a photonic crystal structure formed only in the second conductive type semiconductor layer;
transparent electrodes respectively disposed on the second conductive type semiconductor layers; and
metallic wirings electrically connecting the plurality of light emitting cells with one another,
wherein each of the plurality of light emitting cells is configured to emit light generated in the respective active layer through the photonic crystal structure and the transparent electrode.

2. The device of claim 1, wherein the photonic crystal structure comprises a lattice of holes two dimensionally arranged.

3. The device of claim 2, wherein the holes are filled with an insulating material comprising a different refractive index from the second conductive type semiconductor layer.

4. The device of claim 2, wherein the holes are filled with air.

5. The device of claim 1, wherein the photonic crystal structure comprises a periodic unevenness formed in the second conductive type semiconductor layer.

6. The device of claim 1, wherein the photonic crystal structure comprises a lattice of second conductive type semiconductor rods.

7. The device of claim 6, wherein a space between the rods is filled with an insulating material comprising a different refractive index from the second conductive type semiconductor layer.

8. The device of claim 6, wherein the holes are filled with air.

9. The device of claim 1, further comprising first electrode pads formed on other regions of the first conductive type semiconductor layers and second electrode pads formed on the transparent electrodes, wherein each of the metallic wirings connects the first and second electrode pads of the adjacent light emitting cells.

10. An alternating current (AC) light emitting device, comprising:
a plurality of light emitting cells each comprising a first conductive type semiconductor layer, a second conductive type semiconductor layer disposed on one region of the first conductive type semiconductor layer, an active layer interposed between the first and second conductive type semiconductor layers, and a photonic crystal structure formed in the second conductive type semiconductor layer but not in either the first conductive type semiconductor layer or the active layer;
transparent electrodes respectively disposed on the second conductive type semiconductor layers; and
metallic wirings electrically connecting the plurality of light emitting cells with one another,
wherein each of the plurality of light emitting cells is configured to emit light generated in the respective active layer through the photonic crystal structure and the transparent electrode.

11. The device of claim 10, wherein the photonic crystal structure comprises a lattice of holes two dimensionally arranged.

12. The device of claim 11, wherein the holes are filled with an insulating material comprising a different refractive index from the second conductive type semiconductor layer.

13. The device of claim 11, wherein the holes are filled with air.

14. The device of claim 10, wherein the photonic crystal structure comprises a periodic unevenness formed in the second conductive type semiconductor layer.

15. The device of claim 10, wherein the photonic crystal structure comprises a lattice of second conductive type semiconductor rods.

16. The device of claim 15, wherein a space between the rods is filled with an insulating material comprising a different refractive index from the second conductive type semiconductor layer.

17. The device of claim 15, wherein the holes are filled with air.

18. The device of claim 10, further comprising first electrode pads formed on other regions of the first conductive type semiconductor layers and second electrode pads formed on the transparent electrodes, wherein each of the metallic wirings connects the first and second electrode pads of the adjacent light emitting cells.

* * * * *